United States Patent
Biloiu et al.

(10) Patent No.: US 12,406,833 B2
(45) Date of Patent: Sep. 2, 2025

(54) ION EXTRACTION OPTICS HAVING NON UNIFORM GRID ASSEMBLY

(71) Applicant: Applied Materials, Inc., Santa Clara, CA (US)

(72) Inventors: Costel Biloiu, Rockport, MA (US); Alan V. Hayes, San Jose, CA (US); Christopher Campbell, Newburyport, MA (US); Dmitry Lubomirsky, Cupertino, CA (US)

(73) Assignee: Applied Materials, Inc.

( * ) Notice: Subject to any disclaimer, the term of this patent is extended or adjusted under 35 U.S.C. 154(b) by 276 days.

(21) Appl. No.: 18/208,762

(22) Filed: Jun. 12, 2023

(65) Prior Publication Data

US 2024/0412956 A1   Dec. 12, 2024

(51) Int. Cl.
H01J 37/32 (2006.01)

(52) U.S. Cl.
CPC .. H01J 37/32568 (2013.01); H01J 37/32926 (2013.01)

(58) Field of Classification Search
CPC .......... H01J 37/32926; H01J 37/32568; H01J 37/32917
See application file for complete search history.

(56) References Cited

U.S. PATENT DOCUMENTS

| | | | |
|---|---|---|---|
| 4,873,467 A | 10/1989 | Kaufman | |
| 6,780,341 B2 | 8/2004 | Garcia | |
| 7,716,021 B2 * | 5/2010 | Kameyama | H01J 27/024 703/2 |
| 8,374,830 B2 | 2/2013 | Kameyama | |
| 2008/0179284 A1 * | 7/2008 | Hayes | H01J 37/3053 216/61 |

(Continued)

FOREIGN PATENT DOCUMENTS

| | | |
|---|---|---|
| CN | 105723247 A | 6/2016 |
| JP | 2014005799 A | 1/2014 |

(Continued)

OTHER PUBLICATIONS

International Search Report and Written Opinion for International Application No. PCT/US2024/033374, mailed on Sep. 30, 2024, 10 pages.

(Continued)

*Primary Examiner* — Patrick C Chen
(74) *Attorney, Agent, or Firm* — KDW Firm PLLC

(57) ABSTRACT

A method may include receiving a beam profile function, derived from a beam density of an ion beam along a substrate plane, and generating a mirror function, based upon the beam profile function, wherein a sum of the mirror function and beam profile function generates a flat beam distribution. The method may include receiving a grid pattern for an electrode of an electrode assembly, the grid pattern comprising an array of hole locations, and calculating a normalized beam current as a function hole location for the array of hole locations. The method may further include generating an adjusted set of radii as a function of hole location for the array of hole locations based upon the mirror function and the normalized beam current, and generating an electrode assembly having an array of holes, based upon the grid pattern and the adjusted set of radii.

12 Claims, 11 Drawing Sheets

(56) References Cited

U.S. PATENT DOCUMENTS

| | | | |
|---|---|---|---|
| 2012/0211166 A1* | 8/2012 | Yevtukhov | H01J 37/3053 |
| | | | 250/424 |
| 2021/0035774 A1 | 2/2021 | Inouchi | |
| 2021/0151290 A1* | 5/2021 | Yun | H01L 21/67069 |
| 2023/0056463 A1 | 2/2023 | Matsumoto | |
| 2023/0125435 A1 | 4/2023 | Likhanskii | |

FOREIGN PATENT DOCUMENTS

| | | |
|---|---|---|
| TW | 161269 B | 6/1991 |
| TW | 201101364 A | 1/2011 |
| TW | 201546861 A | 12/2015 |

OTHER PUBLICATIONS

G. Aston et al., "Ion beam divergence characteristics of two-grid accelerator systems" AIAA Journal 16 (1978) 516.

M. Coletti and S. B. Gabriel, "The Applicability of Dual Stage Ion Optics to Ion Engines for High Power Missions" IEEE Trans. Plasma Sci. 40 (2012) 1053.

J. R. Coupland et al., "A Study of the Ion Beam Intensity and Divergence Obtained from a Single Aperture Three Electrode Extraction System" Review of Scientific Instruments 44, 1258 (1973).

Kim et al., "A study of two-stage ion-beam optics" Journal of Applied Physics 49, 517 (1978).

\* cited by examiner

ION EXTRACTION OPTICS HAVING NON UNIFORM GRID ASSEMBLY

FIELD OF THE DISCLOSURE

The disclosure relates generally to plasma processing apparatus, and more particularly to broad beam ion sources.

BACKGROUND OF THE DISCLOSURE

In the present day fabrication of advanced 3D semiconductor devices entail uniform etching of tens of nanometers thick layers of different materials having different etching selectivities.

To fulfill throughput requirements for substrate processing, an ion flux may be provided from ion beam having a diameter large enough to irradiate the whole wafer (substrate), so that an ion beam having a 400 mm diameter may be necessary to process a 300 mm diameter wafer. Therefore, broad ion beam sources having gridded ion extraction optics suitable for such substrate processing are needed. However, these ion beam sources may introduce non-uniformities in the beam current and beam angular divergence across the diameter of the ion beam. Moreover, such non-uniformities may not be correctable by wafer rotation during exposure of the wafer to the ion beam.

In particular, for processing a wafer where the ion beam impacts the wafer at a non-zero angle of inclination with respect to the normal on the wafer surface, an inherent non-uniformity of ion flux is generated as a function of radial position, even for an ion beam having a parallel flux of ion trajectories with zero beam divergence. In addition, finite beam divergence will add another source of non-uniformity. Non-uniformity of plasma density within the source chamber of an ion source will generate a further source of non-uniformity of ion flux as a function of radial position. Even considering an ideal uniform plasma density, when an ion beam is extracted through a uniform grid assembly, the resultant ion flux profile of the ion beam at a substrate will be non-uniform. Attempts to improve ion flux uniformity in an extracted ion beam include creating a non-uniform grid hole density across a gridded electrode assembly and creating a non-uniform grid hole size across the gridded electrode assembly. However, the efficacy of such approaches in achieving uniform ion flux at a substrate may be less than ideal.

With respect to these and other considerations the present disclosure is provided.

BRIEF SUMMARY

In one embodiment, a method is provided. The method may include receiving a beam profile function, derived from a beam density of an ion beam along a substrate plane, and generating a mirror function, based upon the beam profile function, wherein a sum of the mirror function and beam profile function generates a flat beam distribution. The method may include receiving a grid pattern for an electrode of an electrode assembly, the grid pattern comprising an array of hole locations, and calculating a normalized beam current as a function hole location for the array of hole locations. The method may further include generating an adjusted set of radii as a function of hole location for the array of hole locations based upon the mirror function and the normalized beam current, and generating an electrode assembly having an array of holes, based upon the grid pattern and the adjusted set of radii.

In another embodiment, an ion source may include a plasma chamber to house a plasma, the plasma being characterized by an ion flux profile at a plasma edge of the plasma, where the ion flux profile represents a normalized ion beam intensity as a function of radial position. The ion source may further include an electrode assembly, comprising at least two electrodes, where the at least two electrodes are defined by a grid pattern that includes a plurality of holes disposed in a two-dimensional array. As such, the plurality of holes may exhibit a variation in hole radius that is derived from a mirror function, the mirror function being a complementary function to a fitting function for the ion flux profile.

In another embodiment a processing system may include an ion source that includes a plasma chamber to house a plasma. The plasma may be characterized by an ion flux profile at a plasma edge of the plasma, the ion flux profile representing a normalized ion beam intensity as a function of radial position. The ion source may further include an electrode assembly, comprising at least two electrodes having a planar structure that is defined by a grid pattern, where the grid pattern includes a plurality of holes that are disposed in a two-dimensional array. As such, the plurality of holes may exhibit a variation in hole radius that is derived from a mirror function that represents a complementary function to a fitting function for the ion flux profile. The processing system may further include a substrate holder, arranged to support a substrate having a main plane that defines a non-zero angle with respect to a plane of the electrodes.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not to be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are apparatus for improved ion sources that are used to generate uniform ion beams. In various embodiments, an extraction assembly is provided for broad beam ion sources and related processing tools, such as ion beam etching tools.

Figure 1:
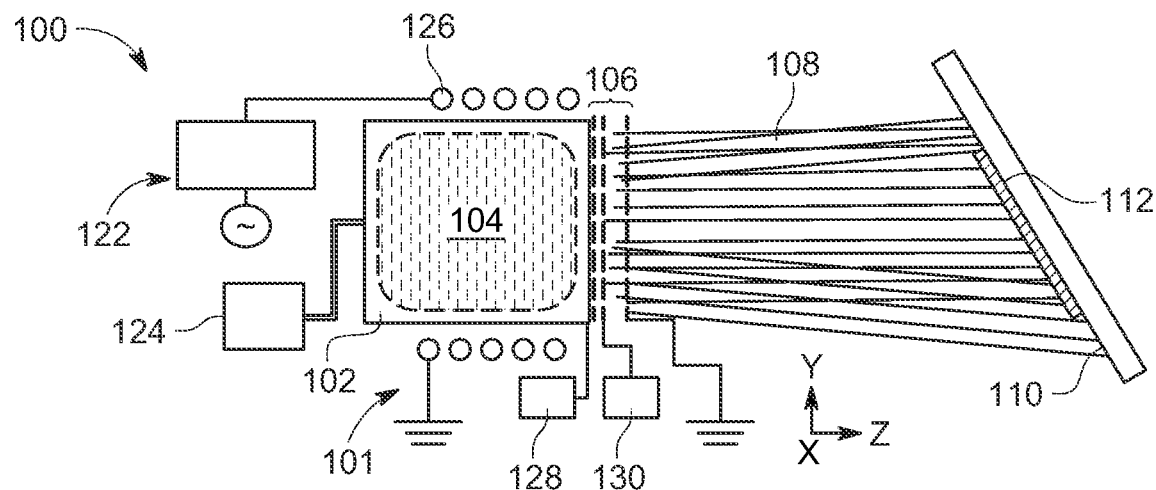
FIG. 1 illustrates a processing system, according to embodiments of the disclosure.

Turning to the figures, FIG. 1 illustrates a processing system 100, according to embodiments of the disclosure. The processing system 100 includes an ion source 101, which source includes a plasma chamber 102 to house a plasma 104, as well as an extraction optics, used to extract an ion beam 108 from the plasma chamber 102. The extraction optics is shown as electrode assembly 106, which assembly may be formed of a plurality of electrodes according to various non-limiting embodiments. In some embodiments, the number of electrodes may be three, where examples of three-electrode assemblies are discussed in more detail with respect to the embodiments to follow. The processing system 100 may include a gas source 124, to provide a gas species to the plasma chamber 102, such as any suitable species for generating the plasma 104. In some non-limiting embodiments, the plasma 104 may be generated by any suitable known means, including a radio frequency (RF) induction approach. For example, the processing system 100 may further include an RF assembly 122, including power source and matching network, as well as antenna 126. In operation, when a plasma 104 is generated, the ion beam 108 may be extracted by applying suitable voltage at different electrodes of the electrode assembly 106. In one embodiment, a first power source 128 may supply a first voltage to a screen grid that is electrically coupled to the plasma chamber 102, a second power source 130 may supply a second voltage to an acceleration grid, located between the screen grid and the substrate, while a third grid, disposed between the acceleration grid and substrate, is grounded. The general operation of such a triode extraction assembly to extract an ion beam is well known and will not be discussed further herein.

In accordance with various embodiments of the disclosure, the processing system 100 may be used to process a substrate 112, disposed on a substrate holder 110 that faces the electrode assembly 106. The substrate holder 110 may be arranged to support the substrate 112 such that the main plane of the substrate 112 defines a non-zero angle with respect to a plane of the electrodes of electrode assembly 106. Said differently, the electrodes of electrode assembly 106 may have a planar shape that lies generally parallel to the X-Y plane of the Cartesian coordinate system shown. The substrate 112 may lie in a plane that is not parallel to the X-Y plane, but rather forms a non-zero angle with respect to the X-Y plane. In this geometry, the ion beam 108 may be provided to the substrate 112 to perform angled deposition or angled etching of the substrate 112.

One aspect of the processing of substrate 112 is that processing of substrate 112 will be non-uniform under ion beam 108, due to the fact that portions of the substrate 112 closer to the electrode assembly 106 will be impacted differently from portions of the substrate 112 that lie at greater distances. It can easily be shown that rotation of the substrate 112 about the Z-axis will not eliminate this non-uniformity in processing. Rather, the rotation of the substrate 112 about the Z-axis will introduce a radial non-uniformity in the processing of substrate 112, where the ion beam treatment will vary as a function of radial position with respect to the center of substrate 112, assuming the substrate 112 is centered with respect to the center of the electrode assembly 106. A further complication arises in the event that the ion beam 108 exhibits divergence where individual trajectories of ions do not all lie parallel to one another. Moreover, the plasma 104 within plasma chamber 102 may be non-uniform in density, leading to non-uniformities in extracted beam current density as a function of position along the radial dimension of the electrode assembly 106.

In accordance with embodiments of the disclosure, an electrode assembly 106 or similar extraction assembly, is provided with a set of electrodes that have a gridded structure designed to account for plasma non-uniformities in a manner that may compensate to generate ion beams having more uniform current density across a substrate, even in the example of angled ion beams. In particular, electrodes for an ion source having a novel grid design are disclosed, where the grid design is based upon a grid formed of an array of holes, where the hole diameter (or radius) is varied across electrode according to characteristics of the ion source plasma chamber and plasma.

Figure 2A:
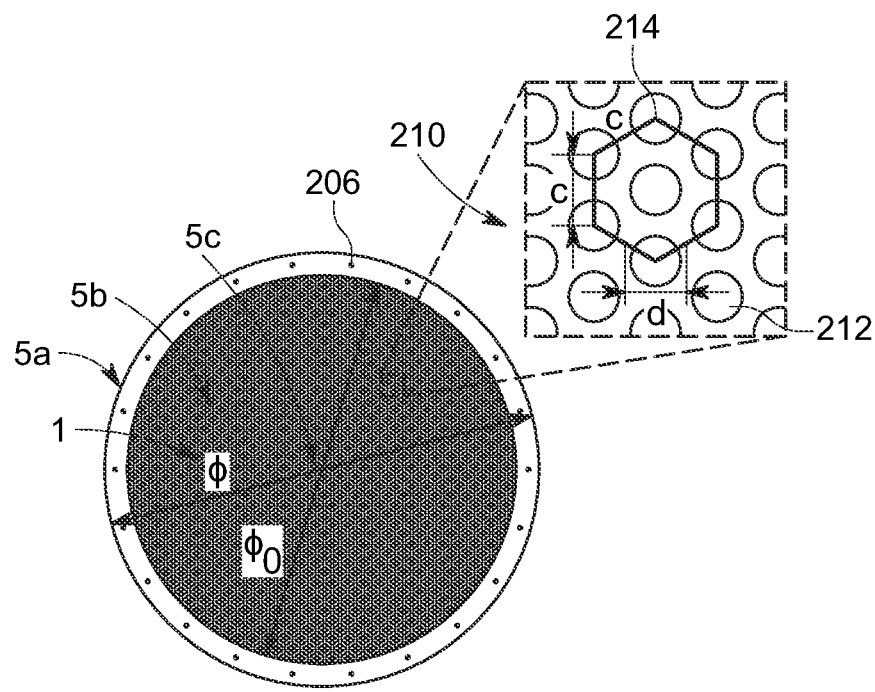
FIG. 2A shows a top plan view of an electrode for an extraction optics, according to other embodiments of the disclosure.
Figure 2C:
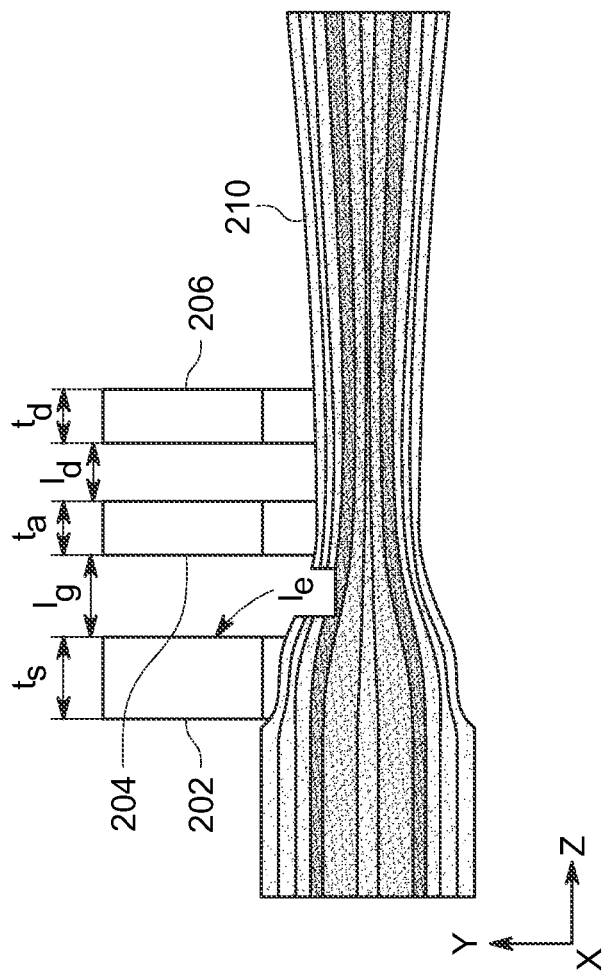
FIG. 2C shows a side view of an electrode assembly, together with the geometry of an extracted ion beam, according to some embodiments.
Figure 2B:
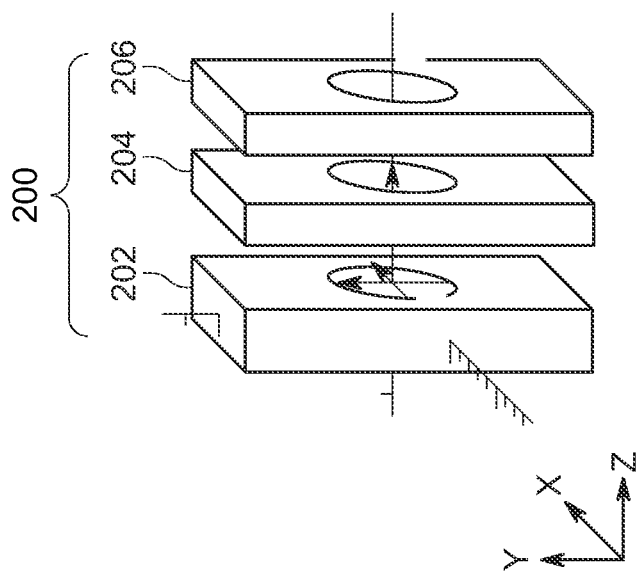
FIG. 2B shows a tilted side view of an electrode assembly, according to the some embodiments of the disclosure.

FIG. 2A shows a top plan view of an electrode for an extraction optics, according to other embodiments of the disclosure, while FIG. 2B shows a tilted side view of an electrode assembly, according to the some embodiments of the disclosure. The electrode 206 may be used, for example, the electrode assembly 106, discussed previously. As shown in the example of FIG. 2B, the electrode 206 may be a deceleration electrode in an electrode assembly that includes a screen electrode 202, and acceleration electrode 204. FIG. 2C shows a side view of the electrode assembly of FIG. 2B, together with the geometry of an extracted ion beam 210, according to some embodiments. Note that the screen electrode 202, acceleration electrode 204 and electrode 206 may be formed identically in some embodiments, where each electrode has a grid structure where an array of holes 212 are arranged in a hexagonal pattern 214. The holes 212 may be circular holes for example with or without tapered edges. The screen electrode 202, acceleration electrode 204, and electrode 206 may be planar structures that lie parallel to one another in the X-Y plane, and may be held in place with respect to one another by spacers made of electrically insulating material like alumina that are mounted toward the periphery of these electrodes 5A, mid radial position 5B, and center of grid 5C. Moreover, the holes of each grid may be aligned with the holes of each other grid. The holes 212 may be characterized by a diameter d with a spacing c. In this configuration, the total extracted ion beam is composed of individual beamlets extracted through individual holes, meaning holes 212. The calculated geometrical transmission for this configuration is given by the sum of holes' area divided by the total area of the grid. However, given the concavity of the plasma meniscus that forms adjacent the screen electrode 202, the effective transmission is slightly higher. The thicknesses of the grids $t_s$, $t_a$, and $t_d$ along with the axial separations $l_g$ and $l_d$ dictates the quality of the extracted ion beam and the amount of extracted current.

In accordance with various embodiments of the disclosure, the radius of the holes 212 may vary across a given electrode of the electrode assembly, such as electrode assembly 106 or electrode assembly. In the present embodiment, the variation of the hole size of holes 212 is controlled in a manner so as to generate a uniform ion beam having less non-uniformity in beam current across the plane of the electrode assembly, and less non-uniformity across a substrate being processed by the extracted ion beam. The approach provided by the present embodiments for fabricating an improved electrode assembly to generate a more uniform ion beam will be explained in more detail in the figures to follow.

The radial beam flux profile (BFP) at the substrate surface is a convolution of the plasma flux density profile (PFP) in the ion source just adjacent to the front of the screen grid and the grid optics function (GOF).

$$BFP(r) = [PFP \otimes GOF](r) = \int_0^r PFP(\xi) GOF(r - \xi) d\xi \quad (1)$$

Figure 3A:
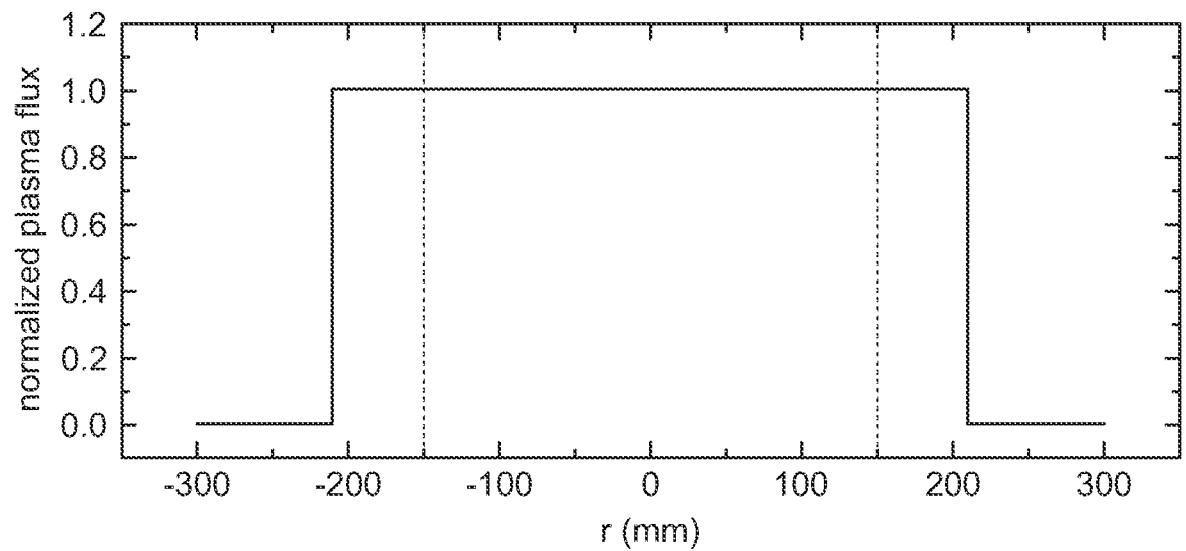
FIG. 3A shows a normalized ion flux profile for an idealized perfectly uniform plasma.
Figure 3B:
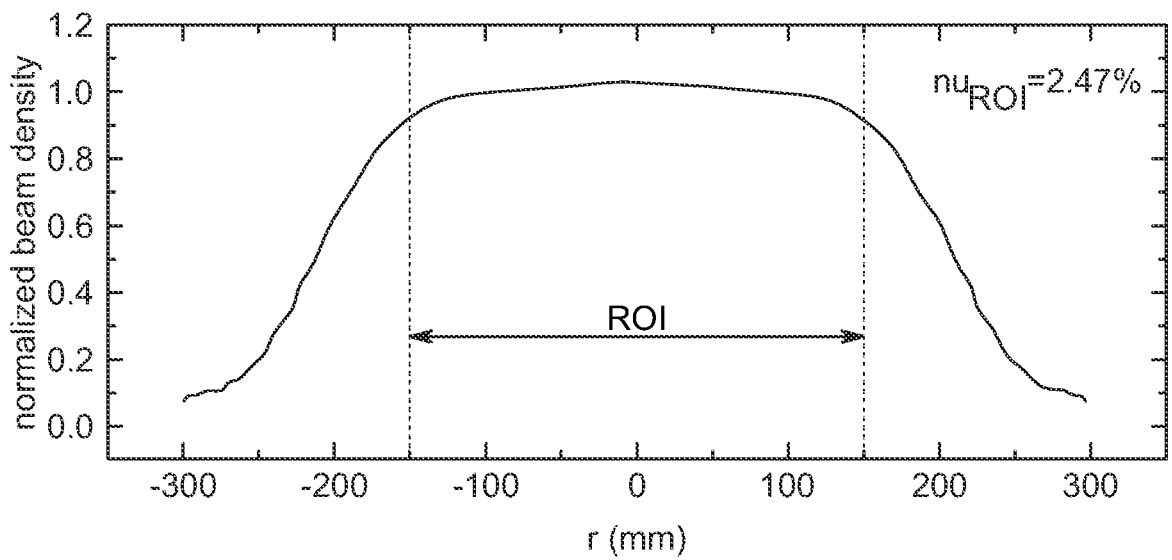
FIG. 3B shows a beam density profile at a substrate position for an ion beam extracted through an extraction optics based upon the ion flux profile of FIG. 3A.

The PFP is mainly dictated by the plasma density while GOF depends on geometrical characteristics of the grid assembly and grids' biasing voltages. FIG. 3A shows a normalized ion flux profile for an idealized perfectly uniform plasma. In the example of FIG. 3A, it is assumed that the plasma flux profile across the plasma edge facing an extraction assembly does not vary as a function of radial position. Thus, the ion flux entering the extraction assembly will be the same at each hole or aperture of a gridded electrode. FIG. 3B shows a beam flux profile at a substrate position for the ion beam extracted through an extraction optics based upon the ion flux profile of FIG. 3A. In spite of the fact that PFP is perfectly flat the BFP at the substrate surface has a non-zero non-uniformity. In other words, even given a uniform PFP of FIG. 3A, generally, given the inherent divergence of the extracted beam, a gridded electrode assembly will produce a non-uniform BFP at the substrate surface, as qualitatively illustrated in FIG. 3B.

Figure 4A:
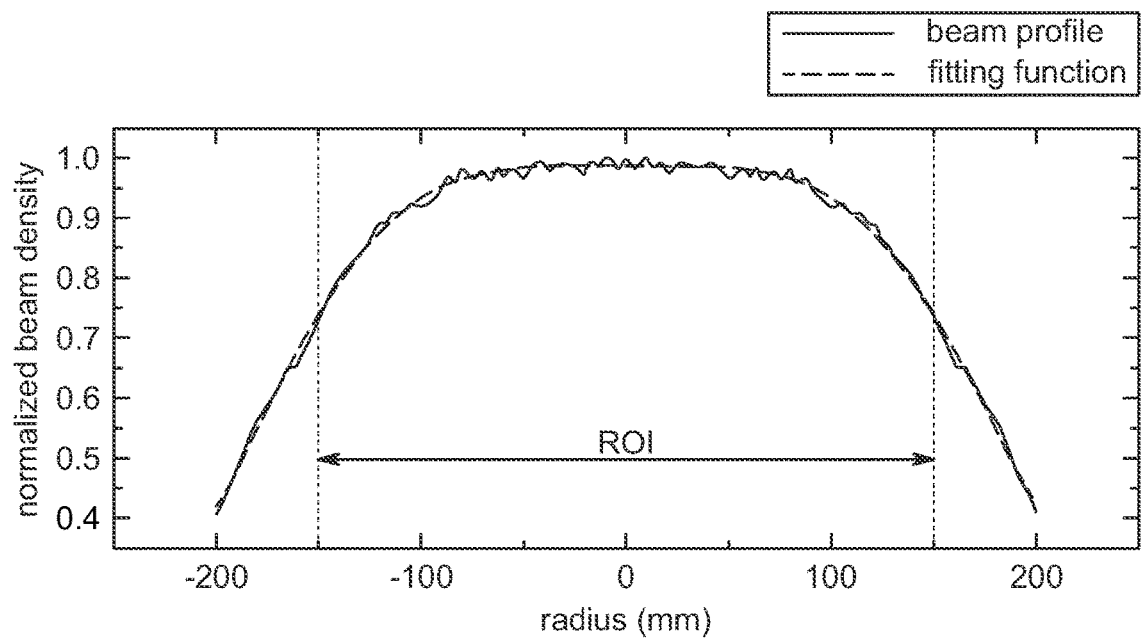
FIG. 4A illustrates an exemplary ion flux profile for a plasma, as well as a fitting function profile.

FIG. 4A illustrates an exemplary radial beam flux profile resulting from a real plasma, as well as a corresponding profile fitting function. The beam flux profile is shown in solid line and exhibits a monotonic decrease from the center of the wafer toward the edge which decrease becomes sharper at radius values above 100 mm. The fitting function profile is shown in dashed lines, where the fitting function used may be a suitable $n^{th}$ order polynomial function, generally expressed as $$F(r) = \sum_{j=0}^{n} a_j r^j \quad (2)$$

where r represents radial position. In one example, n is equal to 7. In accordance with embodiments of the disclosure, using the fitting function of Eq. (2), a mirror function to equation (2) may be derived as:

$$M(r) = \sum_{j=0}^{n} b_j r^j. \quad (3)$$

Figure 4B:
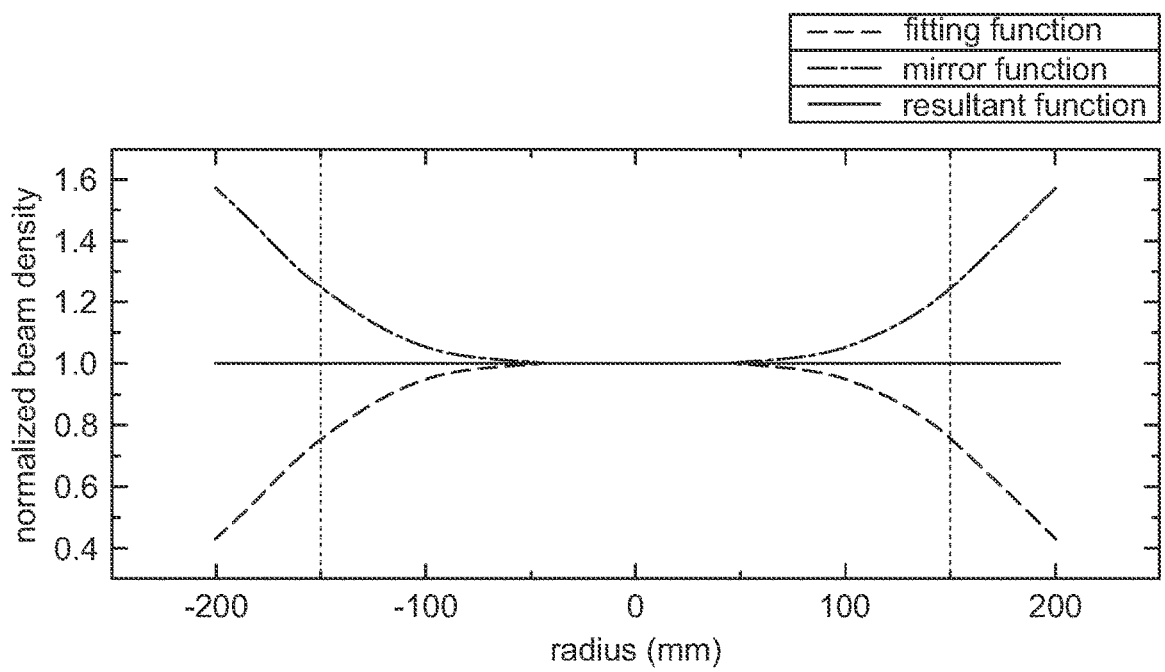
FIG. 4B illustrates the generation of a mirror function based upon the fitting function of FIG. 4A.

As illustrated in FIG. 4B, the mirror function is constructed in a manner such that the mirror function M(r) and fitting function F(r) when composed together will generate a constant normalized beam density as a function of radial position along a substrate plane. Mathematically this condition is expressed as $$a_0 + b_0 = 1, \text{ and } a_j + b_j = 0, \text{ for } j = 1 \ldots n \quad (4)$$

In accordance with embodiments of the disclosure, the mirror function may then be used to calculate the hypothetical normalized beam current $i_k$ for every hole location on a grid that is arranged generally as described above. In other words, every hole in a grid of holes that are arranged in a hexagonal array will may be characterized by a hole location k in the X-Y plane that corresponds to a radial distance in the mirror function M(r). Then, at each hole location k the value of $i_k$ may be calculated based upon the mirror function value at that location. The beam current at a particular location k may be approximated as directly proportional to area of the hole at that location. Using the above approach, a suitable adjustment in the radius of a hole at any location k may then be performed so that the normalized beam density remains constant as a function of radial position across the entire electrode assembly. In one simple example, the radius r of a hole at any position k in the grid may be represented as $r_k$, where $r_k$ is proportional to $(i_k)^{1/2}$. In accordance with embodiments of the disclosure, to more accurately calculate $r_k$, the mirror function M(r) values, discussed above, may be applied to the following function:

$$i_k = \eta \frac{S_k^2}{1 + \lambda S_k^2} \quad (4)$$

where $S_k$ called aspect ratio is the ratio between the radius of the hole of the first electrode grid and the separation between the first electrode and the second electrode at the location k, wherein $S_k=d_k/l_g$. In the equation above q and k are two parameters obtained from the fit of the dependency of beam current vs aspect ratio for the uniform grid obtained either from experimental data or computer generated models.

Figure 5:
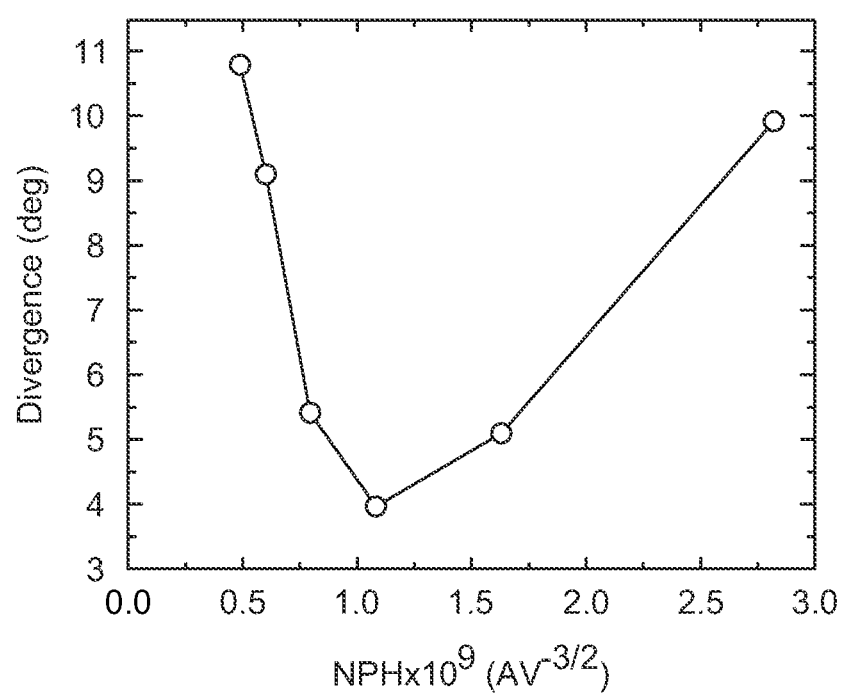
FIG. 5 illustrates the beam divergence for an ion beam extracted through a gridded electrode assembly formed of an array of holes, as a function of normalized perveance per hole.

As detailed below, equation (4) above further corrects for beam non-uniformity introduced by the departure from optimal perveance. As can be seen in FIG. 5, for identical hole geometry and biasing voltages, beam divergence varies with normalized perveance per hole (NPH), which relationship in turn means a beam divergence variation with the beam current. For the configuration shown, the optimal NPH is approximately $1 \times 10^{-9}$ $AV^{-3/2}$ for which value the minimum divergence angle is approximately 4°. Any departure from this value either toward under-perveance regime or toward over-perveance regime results in an increase of the beam divergence. Beam divergence has a complicated dependence on geometrical characteristics of the grid system (hole diameters, grid thicknesses, and grid separations) and operation parameters (ratio between extraction potential drop and acceleration potential drop, ratio between working perveance and maximum perveance). Therefore, when calculating the radial distribution of hole radii from the resulting normalized beam density the perveance of each beamlet is forced to approach the optimum perveance. Equation (4) was obtained empirically and represents the best approximation of the normalized beam current that takes into account the divergence angle, by keeping the working perveance close to the optimal perveance.

Figure 6C:
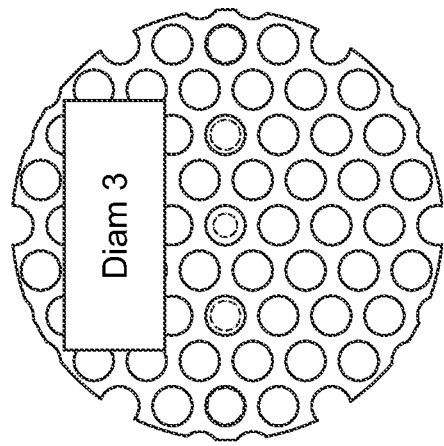
FIG. 6A, FIG. 6B, and FIG. 6C illustrate three alternative grid configurations for non-uniform grid construction, based upon a uniform template having an array of holes having the same diameter.
Figure 6B:
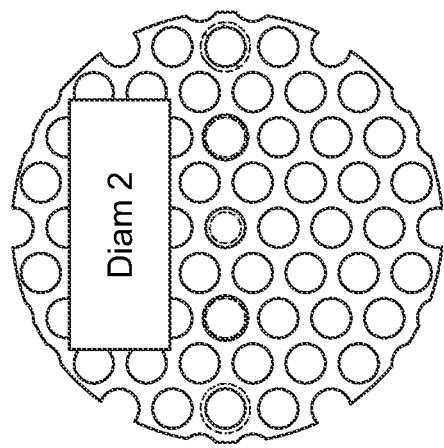
Figure 6A:
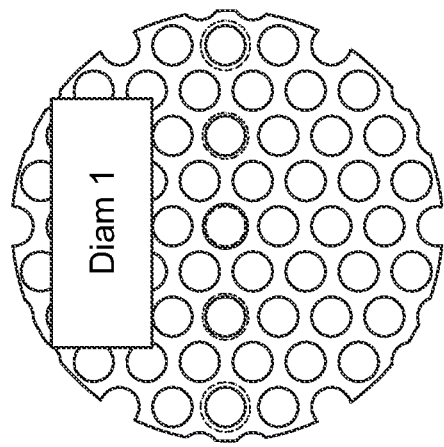
Figure 6D:
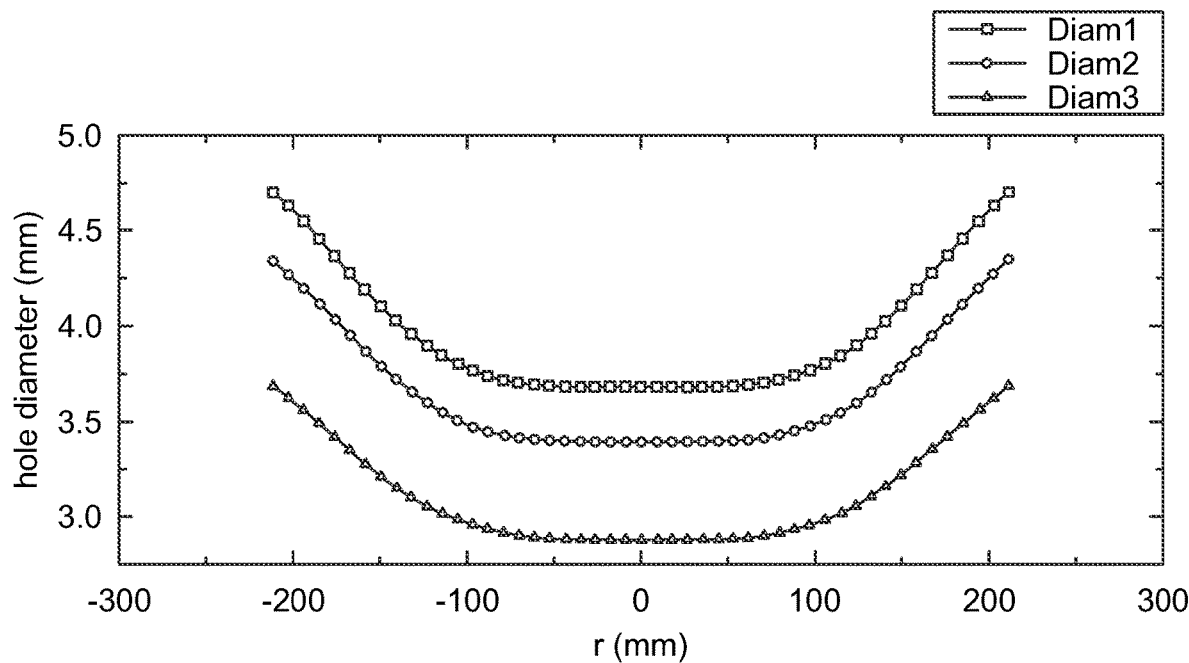
FIG. 6D shows the variation in hole diameter as a function of position on a gridded electrode, for the three configurations shown in FIG. 6A, FIG. 6B, FIG. 6C, respectively.

In accordance with embodiments of the disclosure, an electrode having hole size that varies based upon the aforementioned mirror function may be constructed, starting with a putative or real grid of uniform hole size. The uniform grid may be assumed to have a hole diameter and a hole spacing that provides a suitable structural integrity for the electrode. In other words, the ratio of the hole diameter to the hole separation may be assumed to not exceed a maximum value beyond which value the grid will not be sufficiently stable thermally and mechanically given the fact the grid electrodes are made of metal. Note that fabrication of a grid should take into account a) the fact that the resulting holes' diameters are usually decimal numbers that do not necessarily match the available standard drill bits diameters for a drill system used to fabricate the holes. For the metric system, available drill bits vary by 0.1 mm up to diameters equal to 10 mm. Because for practical applications there are no holes having diameters larger than 10 mm, each calculated $d_k=2r_k$ has to be approximated to the appropriate available drill diameter, i.e, approximation to the first decimal. In addition, b) hole diameters should not exceed a certain value set by the structural integrity of the grid system. In FIGS. 6A-6D three cases are shown for the same function for radial distribution of hole radii as a function of position on the electrode grid. In FIG. 6A, starting with the standard diameter in the center, and increasing toward the edge; in FIG. 6B, the standard hole diameter is placed somewhere at the mid distance between the center and the edge and then in FIG. 6C the standard diameter is place at the edge. Thus, in FIG. 6C, the radius/diameter of holes in the modified electrode configuration are as less than or equal to the radius/diameter of the standard grid configuration. Corresponding radial distributions are shown in FIG. 6D. The distribution shows a monotonic variation of the hole diameter increasing from the center toward the edge. This feature makes the first two cases in FIG. 6A and FIG. 6B less practical, because the sturdiness and structural integrity of the grid may be insufficient at the edge of the grid due to the larger hole diameter.

Figure 7:
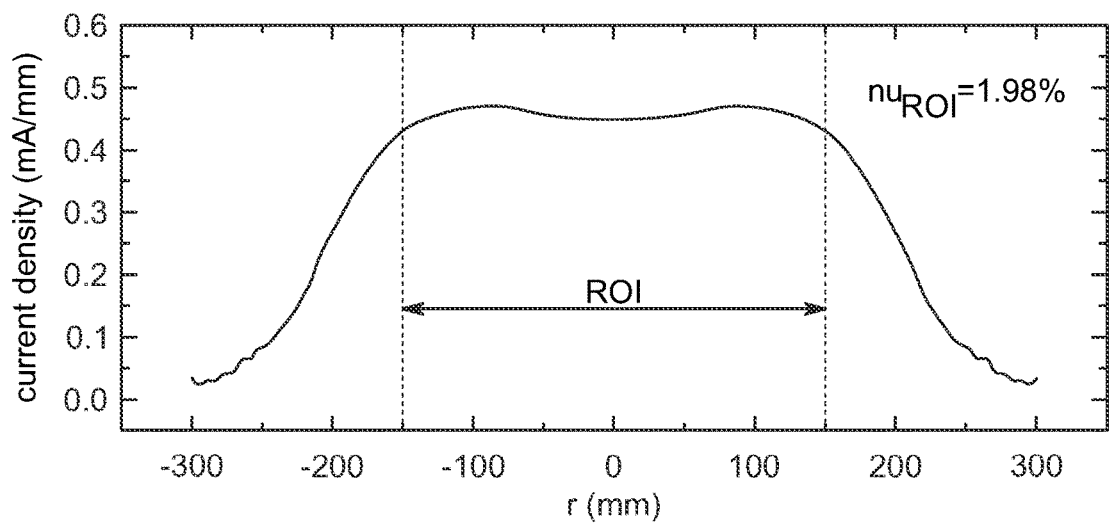
FIG. 7 shows a beam current density profile as function of position on a gridded electrode assembly, arranged according to embodiments of the disclosure.
Figure 8:
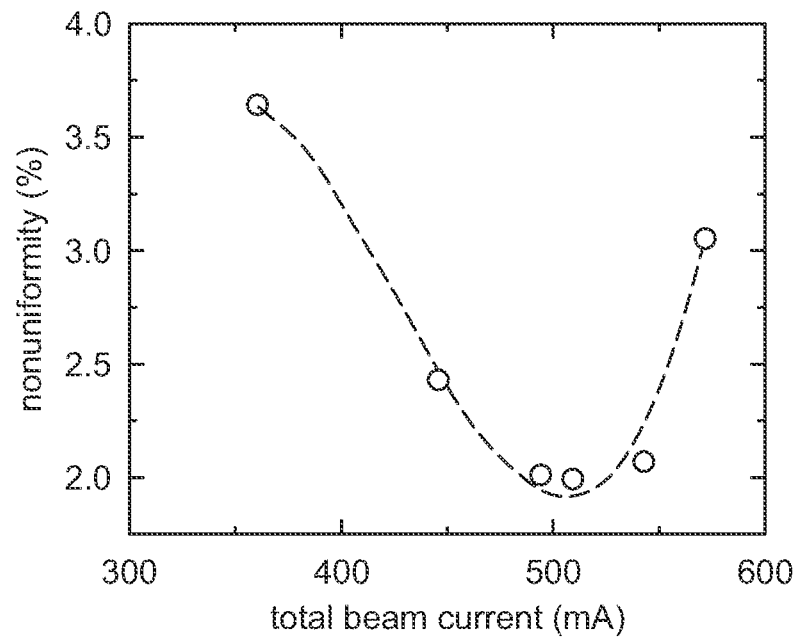
FIG. 8 shows a beam current non-uniformity as a function of total beam current.

FIG. 7 shows a beam current density profile as function of position on a gridded electrode assembly, arranged according to embodiments of the disclosure. The gridded electrode assembly in this example was designed for total beam current of 500 mA. The gridded assembly in particular was designed with an array of holes where the hole radius/diameter varies with radial position from the center of the grid, based upon the aforementioned mirror function. A radial beam profile for a 0 degrees incidence is depicted in FIG. 7. As can be seen, the non-uniformity over 300 mm region of interest (ROI) is below 2%, but will increase somewhat if the total beam current is reduced below 400 mA or increased above 500 mA, as shown in FIG. 8. Nonetheless, the non-uniformity remains below 2.5% over the range of 450 mA to 550 mA. The results indicate that the beam uniformity is correlated to the normalized perveance per hole (NPH) and the best uniformity is obtained with the lowest divergence angle. For the grid system described, 500 mA beam current corresponds to an NPH=$1.19 \times 10^{-9}$ $AV^{-3/2}$. This correlation was verified and confirmed experimentally.

Figure 9A:
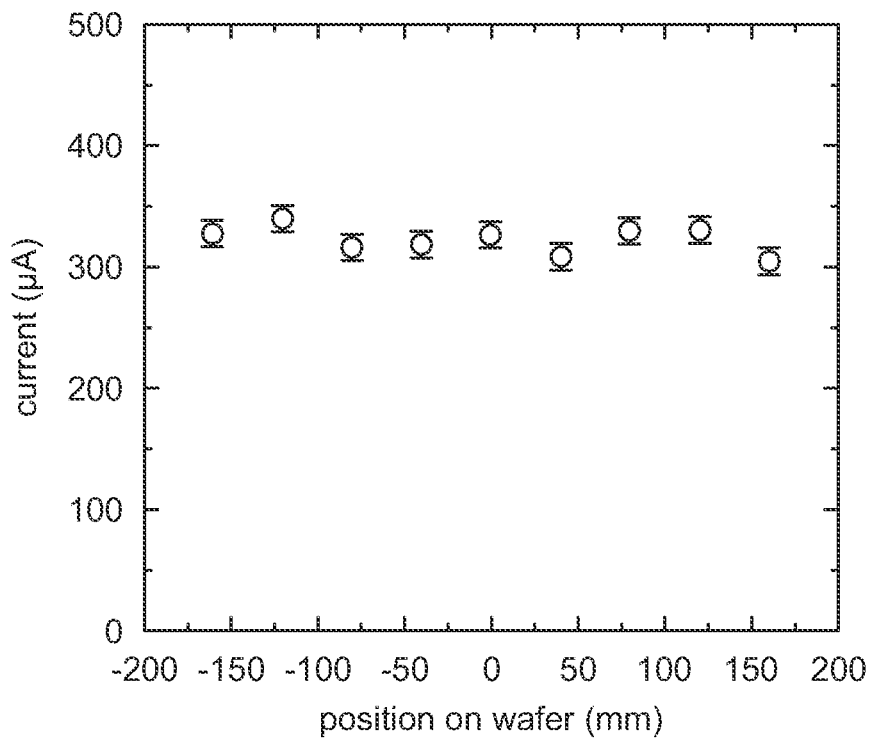
FIG. 9A and FIG. 9B illustrate the results of beam uniformity and mean angle, respectively, for an ion beam extracted to an electrode assembly according to the present embodiment, when the ion beam is incident on a substrate plane at 45 degrees tilt.
Figure 9B:
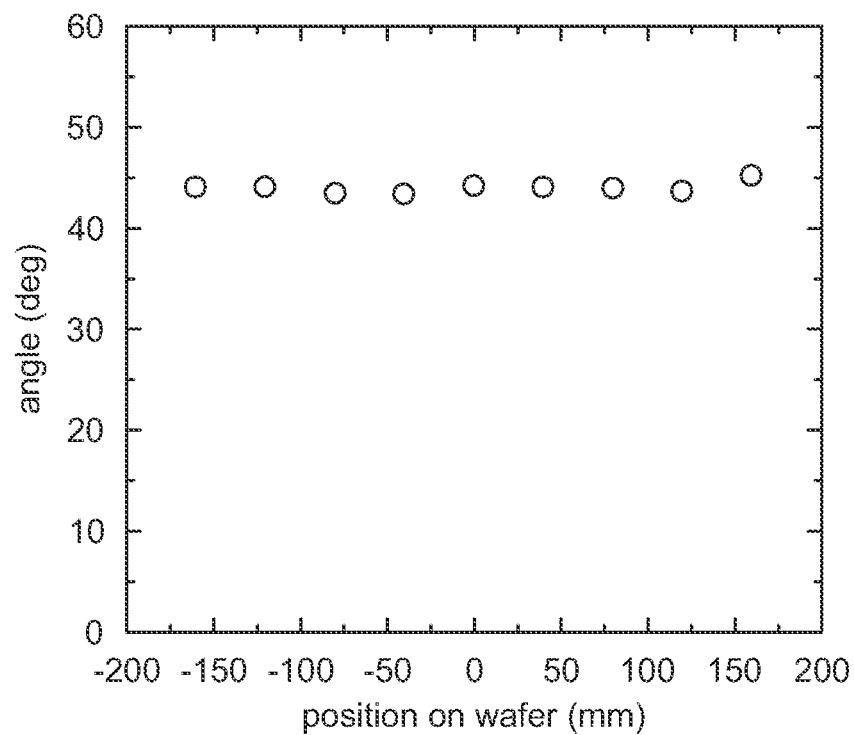

FIG. 9A and FIG. 9B illustrate the results of beam uniformity and mean angle, respectively, for an ion beam extracted to an electrode assembly according to the present embodiment, when the ion beam is incident on a substrate plane at 45 degrees tilt. In this example, the beam current as well as the beam angle remain constant as a function of position across a substrate, over greater than 300 mm distance.

Figure 10A:
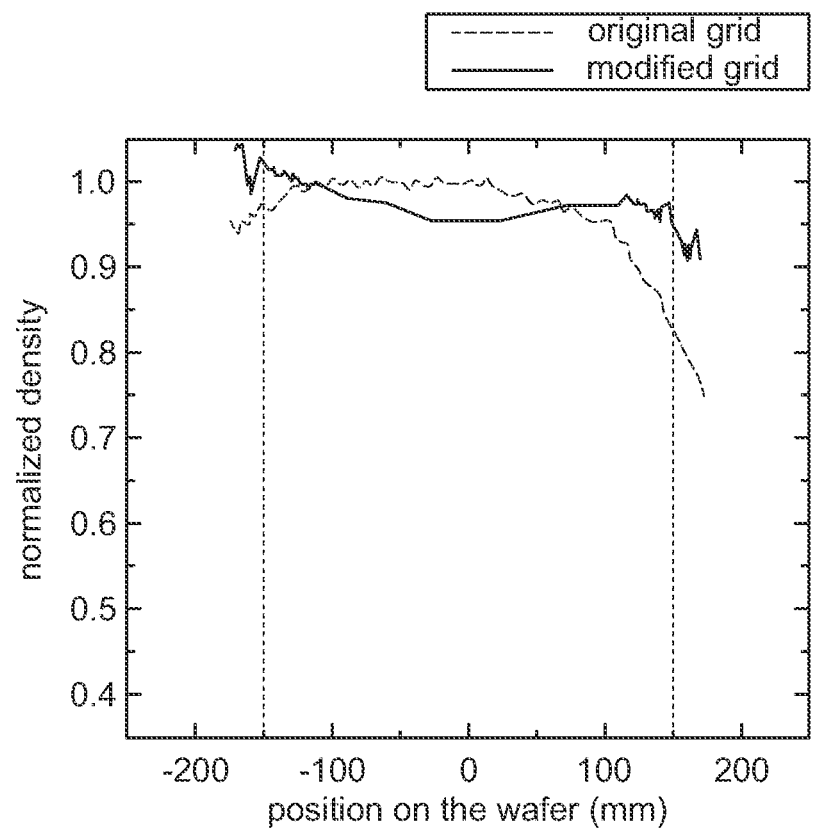
FIG. 10A illustrates the results of normalized current density as a function of position on a substrate, for an ion beam extracted to an electrode assembly according to the present embodiments, in comparison to an electrode assembly having uniform grid configuration.
Figure 10B:
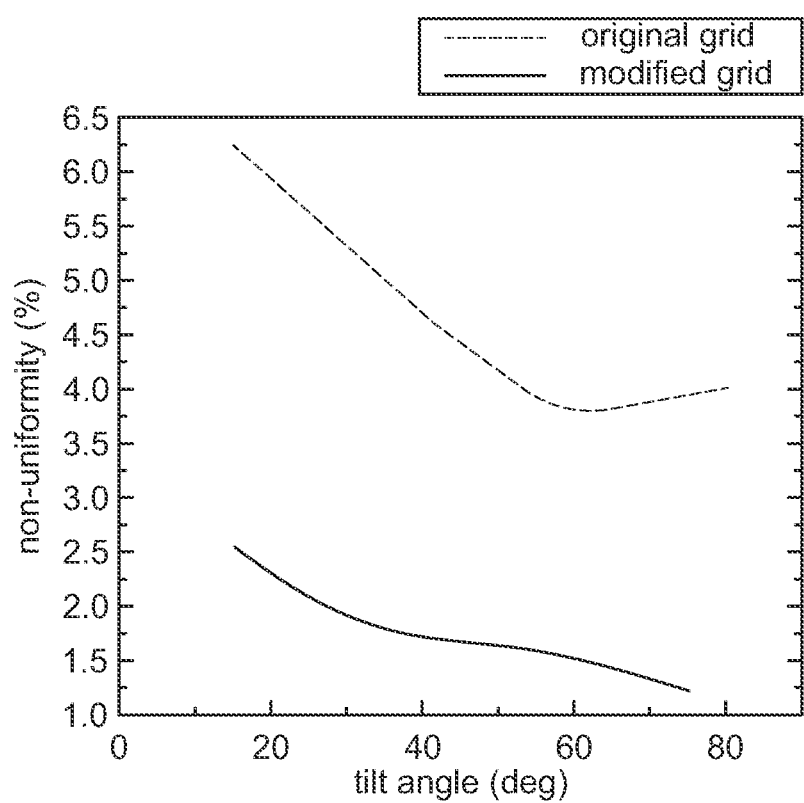
FIG. 10B illustrates the results of beam non-uniformity as a function of angle of incidence on a substrate, for an ion beam extracted to an electrode assembly according to the present embodiments, in comparison to an electrode assembly having uniform grid configuration.

FIG. 10A illustrates the results of normalized current as a function of radial position on a substrate, for an ion beam extracted to an electrode assembly according to the present embodiments, in comparison to an electrode assembly having uniform grid configuration, while FIG. 10B illustrates the results of beam non-uniformity as a function of angle of incidence on a substrate, for an ion beam extracted to an electrode assembly according to the present embodiments, in comparison to an electrode assembly having uniform grid configuration. In particular, FIG. 10A demonstrates the improved beam density uniformity as a function of position across a 300 mm substrate for the electrode assembly arranged according to the present embodiments (solid line), as compared to an electrode assembly having a grid structure of uniform hole size (dashed line).

Regarding the trends in beam non-uniformity as a function of tilt angle of the substrate with respect to the electrode plane, the electrode assembly arranged according to the present embodiments (solid line) exhibits much lower non-uniformity at all angles, as compared to an electrode assembly having a grid structure of uniform hole size (dashed line) and smaller variation with the tilting angle. For example, at a 45 degree angle, the standard grid electrode assembly generates a 4.43% non-uniformity, while the electrode of the present embodiments generates a 1.67% non-uniformity. In terms of relative improvement, the electrode of the present embodiments generates a 70 percent or so reduction in non-uniformity across all angles in comparison the standard grid electrode.

Figure 11:
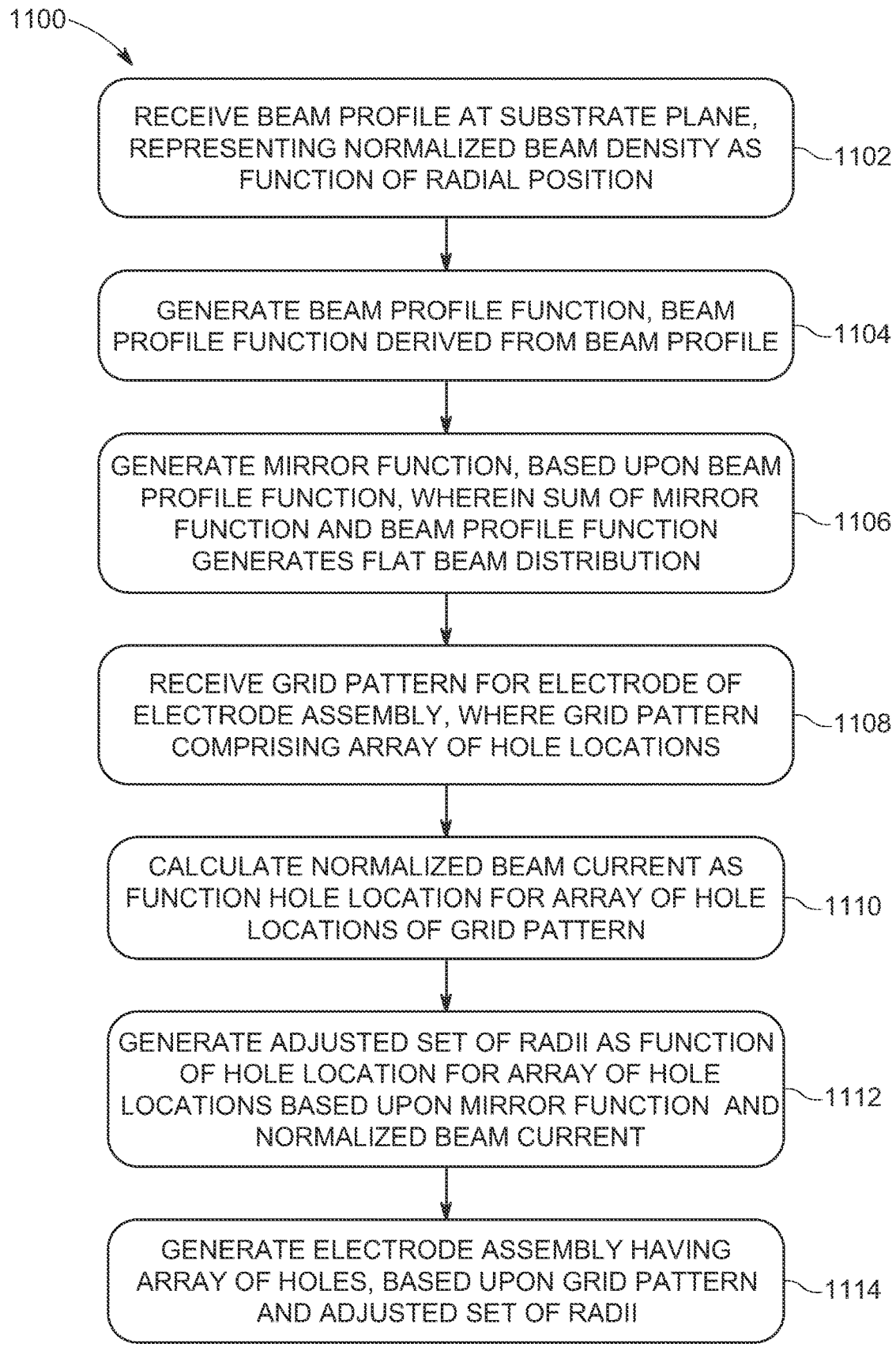
FIG. 11 illustrates an exemplary process flow.

FIG. 11 presents an exemplary process flow 1100. At block 1102, a beam profile at a substrate plane is received which profile may represent a normalized beam density as a function of radial position.

At block 1104, a beam profile function is generated, where the beam profile function is derived from the beam profile. In some non-limiting embodiments, the beam profile function may be an nth level polynomial fit to the beam profile such as a $7^{th}$ order polynomial.

At block 1106, a mirror function is generated, based upon the beam profile function, where a sum of the mirror function and the beam profile function generates a flat beam distribution, meaning a constant beam density as a function of radial position.

At block 1108, a grid pattern is received for an electrode of an electrode assembly to be constructed. The grid pattern may entail an array of hole locations, such as a hexagonal array of hole locations that are equally spaced from one another. In some non-limiting examples, the grid pattern may span a planar range corresponding to a particular overall shape, such as a circle, rectangle, or oval, where the diameter of width of such a grid pattern is in a range of 200 mm, 300 mm, 400 mm or greater. In some non-limiting examples, the hole spacing between adjacent holes in the grid pattern may in the range of 3 mm, 5 mm, 10 mm.

At block 1110, a normalized beam current is calculated as a function of hole location for the array of hole locations of the grid pattern. The normalized beam current may be calculated for each hole location of the grid pattern, where the normalized beam current is calculated in part from the mirror function.

At block 1112, an adjusted set of radii is calculated as a function of hole location for the array of hole locations based upon the mirror function and the normalized beam current.

At block 1114, a modified electrode assembly is generated having an array of holes in each electrode of the electrode assembly, based upon the grid pattern and the adjusted set of radii. In one embodiment, the electrode assembly may be generated by modifying a uniform electrode grid pattern where all holes have the same radius, wherein the hole size of the uniform electrode grid pattern corresponds to the largest hole size in the modified electrode assembly.

In view of the above, the present disclosure provides at least the following advantages: i) the novel electrode assembly provides improved beam uniformity as a function of position, while also providing the additional advantage of uniform angle of incidence as a function of position.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision such modifications within the scope and spirit of the claims appended hereto.

The invention claimed is:

1. An ion source, comprising:
   a plasma chamber to house a plasma, the plasma being characterized by an ion flux profile at a plasma edge of the plasma, the ion flux profile representing a normalized ion beam intensity as a function of radial position; and
   an electrode assembly, the electrode assembly comprising at least two electrodes, the at least two electrodes defined by a grid pattern, the grid pattern comprising a plurality of holes that are disposed in a two-dimensional array,
   wherein the plurality of holes exhibit a variation in hole radius that is derived from a mirror function, the mirror function being a complementary function to a fitting function for the ion flux profile.

2. The ion source of claim 1, wherein the fitting function is an nth order polynomial given by:

$$F(r) = \sum_{j=0}^{n} a_j r^j,$$

wherein the mirror function is given by:

$$M(r) = \sum_{j=0}^{n} b_j r^j,$$

wherein $a_0+b_0=1$,
and wherein $a_j+b_j=0$, for j=1 ... n.

3. The ion source of claim 1, wherein the electrode assembly comprises a first electrode and a second electrode,
   wherein the normalized ion beam intensity as a function of position is represented as $i_k$,
   and wherein $i_k$ is determined based upon a radius of a hole in the array of holes of the first electrode and a separation between the first electrode and the second electrode.

4. The ion source of claim 3, wherein $i_k$ is given $$i_k = \eta \frac{S_k^2}{1 + \lambda S_k^2},$$

wherein $S_k$ is a ratio between the radius of the hole of the first electrode and grid and the a separation between the first electrode and the second electrode at the location k,
wherein $S_k = d_k/l_g$, and
wherein $\eta$ and $\lambda$ are obtained from a fit of a dependency of beam current vs aspect ratio for a uniform grid obtained from experimental data or a computer generated model.

5. The ion source of claim 1, wherein the array of hole locations is a hexagonal array.

6. The ion source of claim 1, wherein the electrode assembly comprises three electrodes, the three electrodes being arranged according to the grid pattern and the mirror function.

7. A processing system, comprising:
   an ion source, comprising:
      a plasma chamber to house a plasma, the plasma being characterized by an ion flux profile at a plasma edge of the plasma, the ion flux profile representing a normalized ion beam intensity as a function of radial position; and
      an electrode assembly, the electrode assembly comprising at least two electrodes the at least two electrodes having a planar structure that is defined by a grid pattern, the grid pattern comprising a plurality of holes that are disposed in a two-dimensional array,
      wherein the plurality of holes exhibit a variation in hole radius that is derived from a mirror function, the mirror function being a complementary function to a fitting function for the ion flux profile; and
   a substrate holder, the substrate holder arranged to support a substrate having a main plane that defines a non-zero angle with respect to a plane of the electrodes.

8. The processing system of claim 7, wherein the fitting function is an nth order polynomial given by:

$$F(r) = \sum_{j=0}^{n} a_j r^j,$$

wherein the mirror function is given by:

$$M(r) = \sum_{j=0}^{n} b_j r^j,$$

wherein $a_0 + b_0 = 1$,
and wherein $a_j + b_j = 0$, for $j = 1 \ldots n$.

9. The processing system of claim 7, wherein the electrode assembly comprises a first electrode and a second electrode,
wherein the normalized ion beam intensity as a function of a position k is represented as $i_k$,
and wherein $i_k$ is determined based upon a radius of a hole in the array of holes of the first electrode and a separation between the first electrode and the second electrode.

10. The processing system of claim 9, wherein $i_k$ is given by $$i_k = \eta \frac{S_k^2}{1 + \lambda S_k^2},$$

wherein $S_k$ is a ratio between the radius of the hole of the first electrode and grid and the a separation between the first electrode and the second electrode at the position k,
wherein $S_k = d_k / l_g$,
and wherein $\eta$ and $\lambda$ are obtained from a fit of a dependency of beam current vs aspect ratio for a uniform grid obtained from experimental data or a computer generated model.

11. The processing system of claim 7, wherein the array of hole locations is a hexagonal array.

12. The processing system of claim 7, wherein the electrode assembly comprises three electrodes, the three electrodes being arranged according to the grid pattern and the mirror function.

* * * * *